US007253797B2

(12) United States Patent
Lee et al.

(10) Patent No.: US 7,253,797 B2

(45) **Date of Patent: *Aug. 7, 2007**

(54) LIQUID CRYSTAL DISPLAY DEVICE

(75) Inventors: Hwa Jeong Lee, Kyoungki-do (KR); Yong Il Kim, Kyoungki-do (KR)

(73) Assignee: Boe Hydis Technology Co., Ltd., Kyoungki-do (KR)

( * ) Notice: Subject to any disclaimer, the term of this patent is extended or adjusted under 35 U.S.C. 154(b) by 438 days.

This patent is subject to a terminal disclaimer.

(21) Appl. No.: 10/669,913

(22) Filed: Sep. 24, 2003

(65) Prior Publication Data

US 2004/0189574 A1 Sep. 30, 2004

(30) Foreign Application Priority Data

Mar. 31, 2003 (KR) ..................... 10-2003-0020196

(51) Int. Cl.
*G09G 3/36* (2006.01)
*H03M 1/66* (2006.01)

(52) U.S. Cl. ........................................ 345/89; 341/144

(58) Field of Classification Search .................. 345/87, 345/89, 98–100; 341/108, 110, 143–144, 341/154

See application file for complete search history.

(56) References Cited

U.S. PATENT DOCUMENTS

| | | | | |
|---|---|---|---|---|
| 5,796,384 A * | 8/1998 | Kim | ........................... | 345/87 |
| 6,222,515 B1 * | 4/2001 | Yamaguchi et al. | .......... | 345/89 |
| 6,380,917 B2 * | 4/2002 | Matsueda et al. | ............. | 345/89 |
| 6,680,733 B2 * | 1/2004 | Woo et al. | .................. | 345/212 |
| 6,750,839 B1 * | 6/2004 | Hogan | ......................... | 345/98 |
| 6,844,839 B2 * | 1/2005 | Lee et al. | .................. | 341/144 |

* cited by examiner

*Primary Examiner*—Amr A. Awad
*Assistant Examiner*—Stephen G Sherman
(74) *Attorney, Agent, or Firm*—Ladas & Parry LLP

(57) ABSTRACT

Disclosed is a liquid crystal display device which is capable of adjusting a contrast ratio by transforming and outputting input data of a reference voltage circuit. Analog voltage signal generator stores an input synchronous signal and a plurality of input digital data signal in response to a write enable signal, and converts the stored digital data signal into a plurality of analog voltage signal pairs in response to an output enable signal. A plurality of reference voltage generators divide a boosted source voltage according to the analog voltage signal pairs from the analog voltage signal generator to generate a plurality of reference voltages. A source driver integrated circuit receives the plurality of reference voltages from the plurality of reference voltage generators.

4 Claims, 3 Drawing Sheets

LIQUID CRYSTAL DISPLAY DEVICE

BACKGROUND OF THE INVENTION

1. Field of the Invention

The present invention relates to an apparatus for adjusting a contrast ratio of a liquid crystal display device, and more particularly to an apparatus for adjusting a contrast ratio of a liquid crystal display device which includes an analog voltage generator in order to adjust the contrast ratio of the liquid crystal display device.

2. Description of the Prior Art

As generally known in the art, when manufacturing a display device using a liquid crystal display device, a contrast ratio among various features is adjusted in order to control image quality of the display device.

Contrast ratio is a ratio between an ability displaying a screen most brightly and an ability displaying the screen most darkly and is related to the sharpness of the screen.

The contrast ratio is expressed by the following equation.

$$\text{CONTRAST RATIO}=\text{MAXIMUM BRIGHTNESS}(cd/m^2)/\text{MINIMUM BRIGHTNESS}(cd/m^2) \quad \text{[Equation 1]}$$

For example, when the brightnesses which a liquid crystal display device displays most brightly and most darkly are 250 $cd/m^2$, and 0.5 $cd/m^2$, the contrast ratio of the liquid crystal display device is expressed as 250/0.5 ($cd/m^2$) by using the equation 1.

FIG. 1 is a graph showing a method which adjusts a contrast ratio. That is, FIG. 1 shows a relationship between a voltage inputted to the liquid crystal display device and a screen brightness of a liquid crystal panel according to the input voltage.

The longitudinal axis indicates the voltage which is inputted to the liquid crystal display device. Reference numeral G (Gain) represents voltage width when embodying maximum and minimum brightnesses. The transverse axis indicates a brightness according to a change of the corresponding transmission factor of a liquid crystal panel when the voltage of the longitudinal axis changes by G width based on a Voffset voltage.

It is assumed that a Voffset1 voltage is set to a minimum brightness voltage. Accordingly, in the case of adjusting G width, the brightness of the screen varies within the range from 0% to 100% as shown in the longitudinal axis. At this time, when it is assumed that the screen brightness of 0% is 0.5 $cd/m^2$ and the screen brightness of 100% is 250 $cd/m^2$, the contrast ratio is calculated as 500 by the equation 1.

When applying a voltage to the liquid crystal panel to change the minimum brightness voltage to Voffset2 and to maintain the G width, the screen brightness varies within the range from 0% to 90%. When it is assumed that the screen brightness of 0% is 0.5 $cd/m^2$ and the screen brightness of 90% is 250 $cd/m^2$, the contrast ratio becomes 450.

That is, when changing Voffest voltage and maintaining the voltage change width, the contrast ratio is reduced from 500 to 450.

FIGS. 2A and 2B are block diagrams showing apparatuses for varying the contrast ratio.

As shown in FIGS. 2A and 2B, when a data input device inputs R, G, B digital data to a scaler device as a vertical synchronous signal and a horizontal synchronous signal, the line and frame butter of the scaler device change a contrast offset voltage of FIG. 1 to change the contrast ratio. Then the scaler device scales the changed digital data which are suited to a liquid crystal display device module and sends the scaled digital data to a data output device. The data output device outputs the changed R, G, B data to a driver.

The driving method of the line buffer and the frame buffer are identical with each other. However, the data transforming method of the line buffer differs from that of the frame buffer only in that the line buffer transforms data in lines and the frame buffer transforms data in frames.

Both of the line buffer and the frame buffer are a memory device, which adjusts the contrast ratio using a hardware-like method. Due the use of the memory device, manufacturing cost increases. Furthermore, since the contrast ratio is fixed by the memory device, it is difficult to adjust the contrast ratio.

SUMMARY OF THE INVENTION

Accordingly, the present invention has been made to solve the above-mentioned problems occurring in the prior art, and an object of the present invention is to provide a liquid crystal display device which is capable of adjusting a contrast ratio by transforming and outputting input data of a reference voltage circuit wherein the reference voltage circuit generates a gamma reference voltage.

In order to accomplish this object, there is provided a liquid crystal display device comprising: an analog voltage signal generator for storing an input synchronous signal and a plurality of input digital data signal in response to a write enable signal, and converting the stored digital data signal into a plurality of analog voltage signal pairs in response to an output enable signal; a plurality of reference voltage generators for dividing a boosted source voltage according to the analog voltage signal pairs from the analog voltage signal generator to generate a plurality of reference voltages; and a source driver integrated circuit for receiving the plurality of reference voltages from the plurality of reference voltage generators, wherein a digital/analog converter of the analog voltage signal generator changes a reference voltage value and outputs a changed reference voltage value to the reference voltage generators, thus changing a range of a contrast ratio according to the changed reference voltage values when a command changing a reference voltage value is transferred to the digital/analog converter.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
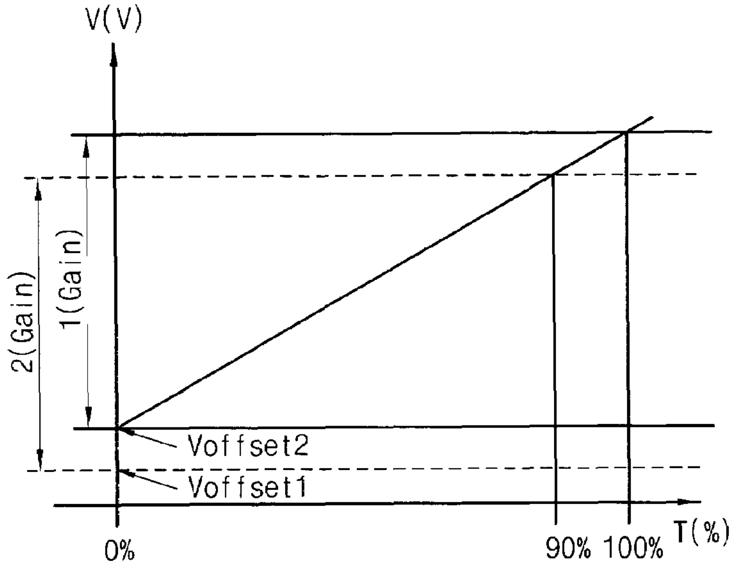
FIG. 1 (PRIOR ART)
FIG. 1 is a graph showing a method which adjusts a contrast ratio.
Figure 2A:
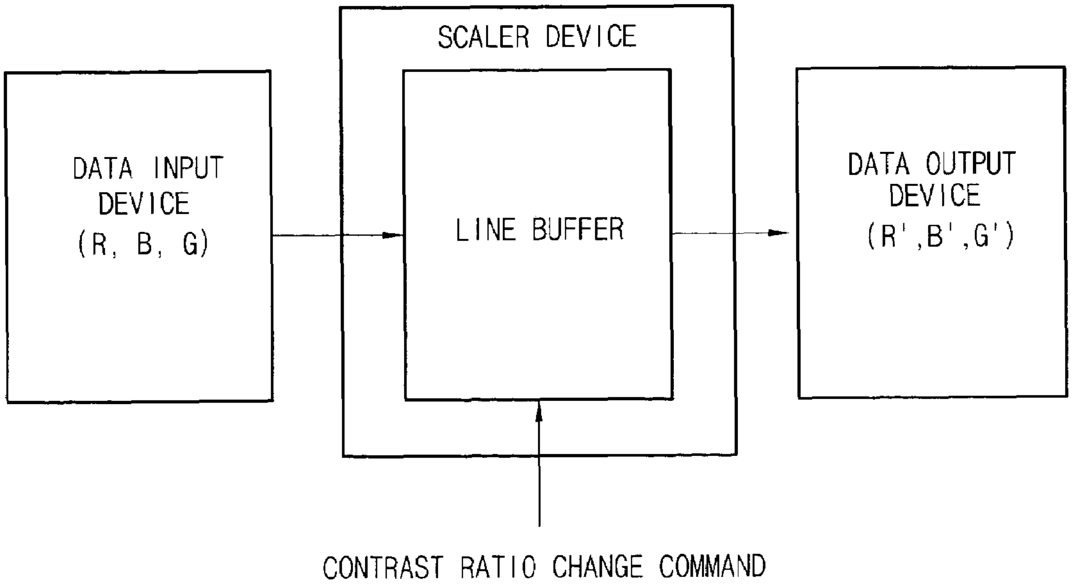
FIGS. 2A and 2B are block diagrams showing apparatuses for varying the contrast ratio.
Figure 2B:
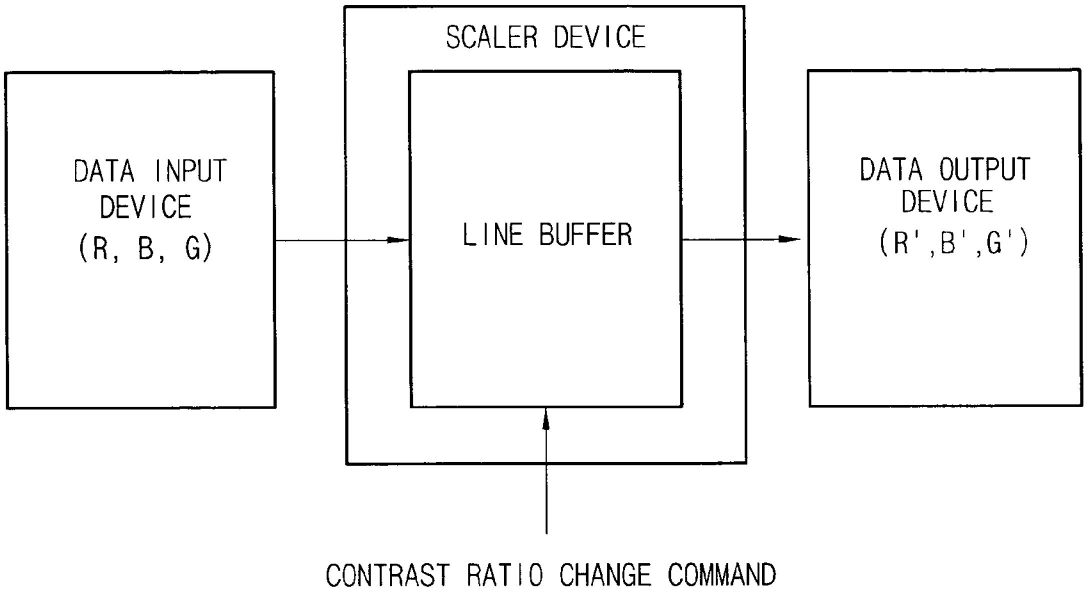
FIG.2B (PRIOR ART)

Hereinafter, a preferred embodiment of the present invention will be described with reference to the accompanying drawings. In the following description and drawings, the same reference numerals are used to designate the same or similar components, and so repetition of the description on the same or similar components will be omitted.

Figure 3:
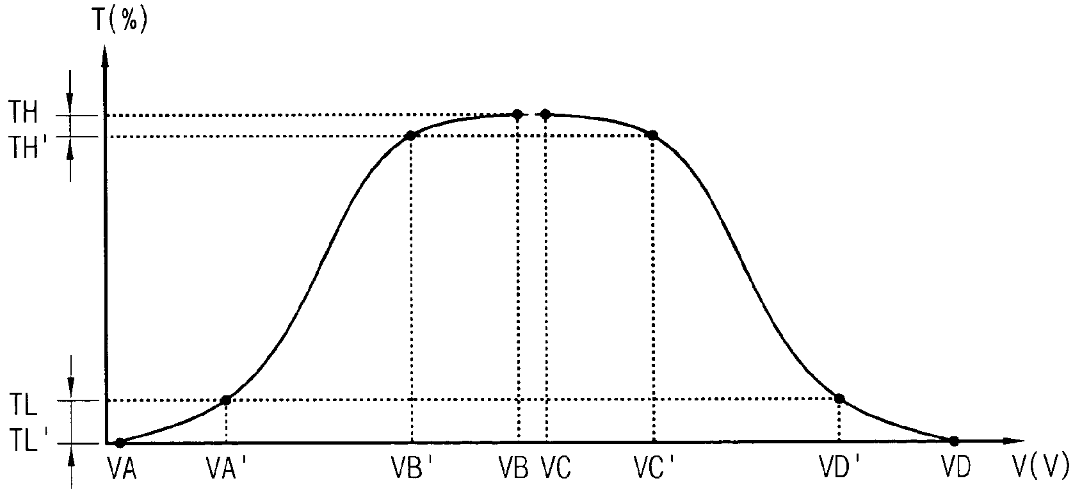
FIG.3 (PRIOR ART)
FIG. 3 is a graph showing a voltage-transmission factor feature curve related to a gamma reference voltage which is used in the present invention.

FIG. 3 is a graph showing voltage-transmission factor feature curve related to a gamma reference voltage which is used in the present invention.

As shown in FIG. 3, the longitudinal axis indicates a voltage applied to a liquid crystal panel and the transverse axis indicates a transmission factor according to the applied voltage.

FIG. 3 is a reference graph used when a gamma reference voltage is generated. That is, FIG. 3 is a graph showing a transmission factor of the liquid crystal panel between minimal and maximal voltages when a voltage is applied to the liquid crystal panel.

Reference numeral V of the longitudinal axis represents a voltage which is applied to the liquid crystal panel. Reference numeral T represents the amount of light which permeates through the liquid crystal panel, when a plurality of voltages are divided by light which is expressed by voltage-transmission factor feature curve shown in FIG. 4. A plurality of reference voltages VA, VB, VC, and VD are determined through the voltage-transmission factor curve.

When a positive voltage is applied to the liquid crystal panel, the reference voltages are VA and VB. When a negative voltage is applied to the liquid crystal panel, the reference voltages are VC and VD. That is, when VB and VC are applied, the brightness of a screen has a maximal value, and when VA and VD are applied, the brightness of the screen has a minimal value.

The voltage difference between VA~VB or VC~VD becomes a gamma reference voltage which determines the contrast ratio of the liquid crystal display device. The gamma reference voltage is a reference voltage required when a voltage corresponding to RGB digital data is outputted to a source driver. A voltage divider having a plurality of resistors divides a voltage and outputs the divided voltage to the source driver as a gamma reference voltage.

Hereinafter, the voltage-transmission factor curve and the contrast ratio will be described.

It is assumed that a transmission curve when a positive voltage is applied is symmetrical to that in the case when a negative voltage is applied, a maximum brightness of a screen is reduced from VB to VB'. Consequently, the contrast ratio is also reduced from TH to TH'. That is, it is assumed that the screen brightness is 250 cd/$m^2$ when TH is 100%. When TH is 100%, the screen brightness is 250 cd/$m^2$. Consequently, the contrast ratio is reduced from 500 to 450.

Figure 4:
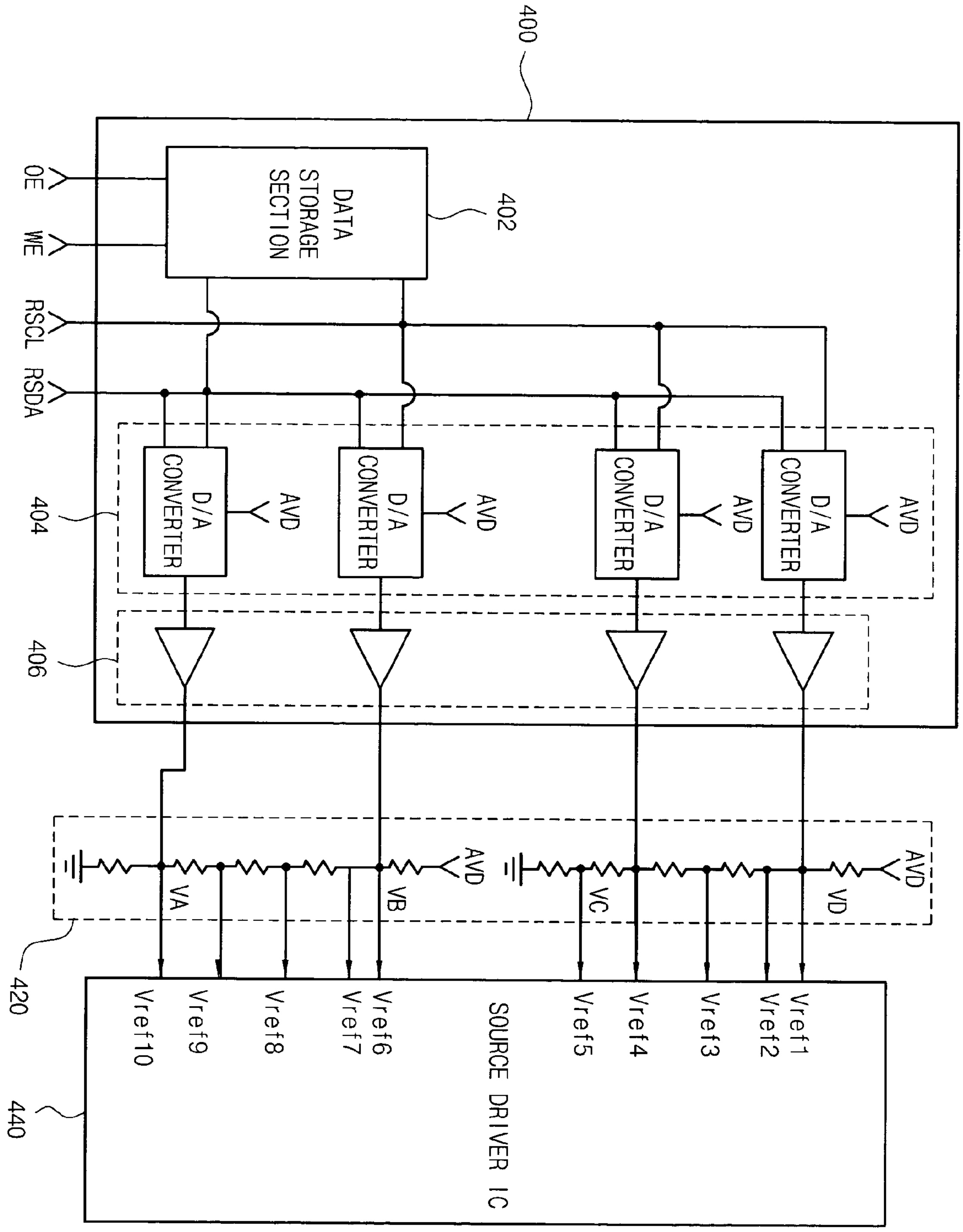
FIG. 4 is a circuitry diagram showing a configuration of an apparatus for adjusting a contrast ratio of a liquid crystal display device according to an embodiment of the present invention

FIG. 4 shows a configuration of an apparatus for adjusting a contrast ratio of a liquid crystal display device according to an embodiment of the present invention.

As shown in FIG. 4, the apparatus for adjusting a contrast ratio of a liquid crystal display device according to the present invention includes an analog voltage generator 400, a reference voltage generator 420, and a source driver integrated circuit 440.

The analog voltage signal generator 400 includes a data storage section 402, digital/analog converter 404, and a buffer amplifier 406. The data storage section 402 stores the input synchronous signal RSCL and the plurality of input digital data signals in response to the write enable signal. The digital/analog converter 404 converts the plurality of input digital data signals stored in the data storage section 402 into a plurality of analog signals in response to the input synchronous signal RSCL when the output enable signal is generated. The buffer amplifier 406 amplifies the plurality of input analog signals and outputs the plurality of analog voltage signal pairs.

When a contrast ratio change command is inputted to an analog voltage signal generator 400 through a synchronous signal RSCL and an address signal RSDA, the synchronous signal RSCL is inputted to a digital/analog converter 404. The digital/analog converter 404 changes an original reference voltage to generate a changed reference voltage according to the digital data. The changed reference voltage is outputted to the buffer amplifier 406.

That is, when the contrast ratio change command is not generated, the synchronous signal RSCL and the digital data signal are stored in the data storage section 402 so that the reference voltages VA, VB, VC, and VD determined by the voltage-transmission factor feature curve are outputted. According to a user's contrast ratio change command, the digital/analog converter 404 converts and outputs the reference voltages VA, VB, VC, and VD by changing the digital data signal.

The digital data signal includes a start signal, an address signal, a data signal, and an end signal. Each of the start signal and the end signal is a 1-bit signal. The address signal varies according to the number of buffer amplifiers. When 4 buffer amplifiers are required, the address signal needs at least 3 bits. Bit numbers of data lines in the data signal vary according to a resolution. The resolution is set according to a user's selection.

For example, where a source voltage AVDD is 10 V, when forming the address by 6 bits, a voltage to be divided becomes AVDD*1/64, so that the voltage is increased or reduced by 0.156 V. When forming the address by 8 bits, a voltage to be divided becomes AVDD*1/256, so that the voltage is increased or reduced by 40 mV.

The plurality of reference voltage generators 420 include a plurality of resistors connected to each other in series between a power supply terminal AVD and a ground terminal. The reference voltage generators 420 divide a boosted source voltage according to the analog voltage signal from the analog voltage signal generator 400 to generate the plurality of reference voltages VA, VB, VC, and VD. The reference voltages VA, VB, VC, and VD are outputted to the source driver integrated circuit 440.

The source driver integrated circuit 440 receives the plurality of reference voltages VA, VB, VC, and VD from the plurality of reference voltage generators 420, and selects and outputs a reference voltage corresponding to R,G,B digital data signals to a liquid crystal panel.

In other words, when the contrast ratio change command is inputted to the analog voltage signal generator 400 as the digital data signal RSCL using a digital data terminal of the analog reference voltage generators 420, the digital data signal RSCL is transferred to the digital/analog converter 406.

The digital/analog converter 404 changes the reference voltage to generate a changed reference voltage according to the digital data signal. The changed reference voltage is transferred to the plurality of reference voltage generators 420 through the buffer amplifier 404.

At this time, left, right, and select terminals of an OSD are used or a register value of the analog voltage signal generator 400 is controlled in order to adjust in a hardware-like method the analog voltage signal generator 400.

In the conventional method, the memory device such as a line buffer or a frame buffer is used in order to adjust the contrast ratio. However, according to the liquid crystal display device of the present invention as described above, the contrast ratio is easily adjusted. Furthermore, the manufacturing cost is reduced and the screen brightness is adjusted according to a user's selection.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A liquid crystal display device comprising:

an analog voltage signal generator storing an input synchronous signal and storing a plurality of data values, which represent a plurality of input digital data signals in response to a write enable signal, said analog voltage signal generator also converting stored digital data signals into a plurality of different analog voltage signal pairs in response to an output enable signal;

a plurality of reference voltage generators for dividing a boosted source voltage according to the analog voltage signal pairs from the analog voltage signal generator to generate a plurality of reference voltages; and a source driver circuit for receiving the plurality of reference voltages from the plurality of reference voltage generators, wherein a digital/analog converter of the analog voltage signal generator changes a reference voltage value and outputs a changed value reference voltage to the reference voltage generators, to thereby change a contrast ratio according to changed reference voltage values when a command to change a reference voltage value is transferred to the digital/analog converter.

2. A liquid crystal display device as claimed in claim 1, wherein the analog voltage signal generator includes:

a data storage section, which stores the input synchronous signal and which stores the plurality of input digital data signals in response to the write enable signal;

the digital/analog converter converting the plurality of input digital data signals stored in the data storage section into a plurality of analog signals in response to the input synchronous signal when the output enable signal is generated; and a buffer amplifier amplifying the plurality of input analog signals and outputting the plurality of analog voltage signal pairs.

3. A liquid crystal display device as claimed in claim 2, wherein the data storage section stores a fixed reference voltage signal pair according to voltage-transmission factor curve feature, and the digital/analog converter changes the fixed reference voltage signal pair stored in the storage section in response to an external reference voltage change command and outputs a changed reference voltage.

4. A liquid crystal display device as claimed in claim 1, wherein the plurality of reference voltage generators include a plurality of resistors connected to each other in series between a power supply terminal and a ground terminal for generating the plurality of reference voltages.

* * * * *